(12) United States Patent
Gerald, II et al.

(10) Patent No.: US 6,191,583 B1
(45) Date of Patent: Feb. 20, 2001

(54) NUCLEAR MAGNETIC RESONANCE DETECTOR USED FOR REDUCING PROBE RINGING

(75) Inventors: Rex E. Gerald, II, Brookfield; Luis H. Nunez, Elmhurst; Jerome W. Rathke, Lockport, all of IL (US)

(73) Assignee: The University of Chicago, Chicago, IL (US)

( * ) Notice: Under 35 U.S.C. 154(b), the term of this patent shall be extended for 0 days.

(21) Appl. No.: 09/360,553

(22) Filed: Jul. 26, 1999

(51) Int. Cl.[7] .................................................. G01V 3/00
(52) U.S. Cl. .......................... 324/318; 324/322; 324/321
(58) Field of Search ..................................... 324/318, 321, 324/322, 300, 307

(56) References Cited

U.S. PATENT DOCUMENTS

| | | | |
|---|---|---|---|
| 5,045,793 | * 9/1991 | Rathke | 324/318 |
| 5,574,370 | 11/1996 | Woelk et al. | 324/320 |
| 5,744,957 | * 4/1998 | Vaughan | 324/318 |
| 6,046,592 | * 4/2000 | Rathke et al. | 324/321 |

* cited by examiner

Primary Examiner—Christine K. Oda
Assistant Examiner—Brij B. Shrivastav
(74) Attorney, Agent, or Firm—Mason, Kolehmainen, Rathburn & Wyss

(57) ABSTRACT

A toroid cavity detector includes an outer cylindrical housing through which extends a wire along the central axis of the cylindrical housing from a closed bottom portion to the closed top end of the cylindrical housing. In order to analyze a sample placed in the housing, the housing is placed in an externally applied static main homogeneous magnetic field ($B_0$). An RF current pulse is supplied through the wire such that an alternately energized and de-energized magnetic field ($B_1$) is produced in the toroid cavity which $B_1$ field is oriented perpendicular to the $B_0$ field. Following the RF current pulse, the response of the sample to the applied $B_0$ field is detected and analyzed. In order to minimize the detrimental effect of probe ringing, the cylindrically shaped housing is elongated sufficiently in length so that the top and bottom portions are located in weaker, fringe areas of the static main magnetic $B_0$ field. In addition, a material that tends to lessen the effect of probe ringing is positioned along the top and bottom ends of the toroid cavity. In another embodiment of the present invention, a plug is positioned adjacent the inside of the top and bottom ends of the toroid cavity so that the sample contained in the toroid cavity is maintained in the strongest and most homogeneous region of the static magnetic $B_0$ field.

19 Claims, 3 Drawing Sheets

NUCLEAR MAGNETIC RESONANCE DETECTOR USED FOR REDUCING PROBE RINGING

CONTRACTUAL ORIGIN OF THE INVENTION

The United States Government has rights in this invention pursuant to Contract No. W-31-109-ENG-38 between the United States and The University of Chicago.

BACKGROUND OF THE INVENTION

1. Field of the Invention

The present invention relates to an apparatus used in nuclear magnetic resonance (NMR) imaging, and more particularly, to a new and improved toroid cavity detector that reduces the effects of probe ringing when the toroid cavity detector is used in connection with NMR spectroscopy and tomographic imaging.

2. Background of the Invention

Large inventories of uncharacterized and heterogeneous nuclear material need to be characterized. Nuclear magnetic resonance (NMR) techniques have been used as a nondestructive assay (NDA) to characterize these materials before packaging (in particular to determine moisture content) and also to examine the materials after they have been packaged. One NMR technique that has been used involves a toroid cavity probe. This technique enables the determination of both the presence and quantity of individual elements as well as full chemical-shift resolution (i.e., chemical speciation). For example, determinations can be made as to the presence of hydrogen in such materials and as to whether hydrogen is bound with oxygen (water) or another element such as a salt. At the same time, protons in other forms, such as hydrides, hydrates and acids, also are detectable and quantifiable.

The ability to make such determinations and the sensitivity of toroid-based NMR imaging makes this type of technique ideal for special nuclear material (SNM) characterization before such material is packaged. In fact, such nondestructive methods of examination of such SNM provides reductions in work force radiation exposure. Moreover, such techniques possibly could be used to determine select fission and activation products for a wide variety of critical applications (such as waste management and SNM management, control and accountability) and could be used to meet international safeguards with respect to the management of such products.

In one type of toroid cavity detector, a sample to be analyzed is placed in the toroid cavity and the toroid cavity is placed in an externally applied static main homogeneous magnetic field ($B_0$). The presence of the $B_0$ field causes the magnetic moments of a targeted class of nuclei in the sample to precess about the field's axis at a rate which is dependent on the magnetic field strength. Another magnetic field ($B_1$) is produced that is perpendicular to the $B_0$ field and is alternately energized and de-energized within the cavity. In the case where the $B_1$ field is produced by a radio frequency (RF) transmitter pulse applied to an inner wire extending along the central axis of the cavity, the net sample magnetization is caused to rotate about the $B_1$ field axis. Following the RF pulse, the response of the sample to the applied field is detected and in most applications, received signals from the energized nuclei serve as input signals for spectroscopic analysis of the sample.

One of the unique features of the toroid cavity detector compared to some other types of detectors is the full containment of the RF magnetic field flux that is generated when the inner wire is pulsed with an RF current. As a result, the RF magnetic field flux that emanates from a sample contained within the toroid cavity and subjected to an excitation pulse of electromagnetic radiation is completely captured (i.e., detected). This feature makes the toroid cavity detector two to four times more sensitive to weak nuclear resonance signals than conventional coil resonators and allows a quantitative measurement of the total number of NMR-active nuclear spins in the sample, not possible with currently available NMR detectors.

For samples placed in a magnetic field of sufficiently high homogeneity, it is possible to record different chemical species containing a common nucleus. Not only can a proton be distinguished from a uranium nucleus, but also protons in water molecules can be distinguished from protons in hydrogen gas molecules. In fact, protons in water molecules that are in different physical environments can be distinguished. The resolving capability of chemical shift makes the toroid cavity detector a useful device for analyzing and monitoring various types of radioactive materials from spent nuclear fuel to plutonium ash.

Another technique that can be used with a toroid cavity detector is rotating frame imaging (RFI). An asymmetrically shaped transmitter coil is used to achieve a $B_1$ field gradient within the sample region. Different regions of the sample absorbs energy at different rates because the energy absorption process is controlled by the local strength of the $B_1$ field. Thus, RFI can be used to image a homogeneously filled toroid cavity such that the relative quantity of sample that is located at each accessible value of the $B_1$ field can be measured. As a result, this technique can be used to determine the diffusion coefficients of nuclei and the molecular species of the nuclei.

The toroid cavity detector also differs from other, more conventional electromagnetic detectors in that it produces a gradient in the generated RF magnetic field. This $B_1$ field gradient has a mathematically well-defined spatial distribution. This magnetic field gradient feature has two significant consequences. First, the sensitivity of the toroid cavity is radially distributed, with the greatest sensitivity near the central axis of the device. This enables measurements on samples of limited quantity. Second, concentric annular regions of a sample contained in the toroid cavity exchange energy with the resonator circuit at different rates. Thus, analysis of energy transfer rates in a toroid cavity can yield a radial spatial mapping of the different nuclear constituents in a cylindrical sample container. The toroid cavity also has been proven to function with asymmetric conductors.

A simple extension of the spatial imaging capability of the toroid cavity detector is the ability to spin-label the sample with nuclear magnetization alternating in opposite polarities in a series of concentric cylindrical shells. With this labeling procedure, mobility of nuclei within the cavity can be measured. The mobility can be stochastic or coherent and it can be measured on a variable length scale extending from a few micrometers to several millimeters. This technique is suitable for measuring transport velocities of fluids and gases within a sealed container or at the interior surface of a canister where there might be perfusion.

As is disclosed in U.S. Pat. No. 5,574,370, the toroid cavity of a toroid cavity detector can be a cylindrically shaped, hollow housing which is closed at both opposite ends and made for example of copper. A central conductor consisting of an inner wire in a Teflon outer jacket is fed through the base of the cylinder and is positioned coincident with the major axis of the cylinder. In alternate embodiments disclosed in the '370 patent, slots are machined in the side walls, top and bottom of the toroidal cylinder to provide access to the toroid cavity for a fluid or gas sample being analyzed by the toroid cavity detector or a series of openings and sample holders can be positioned in the top of the toroidal cylinder in order to provide access for tubes containing the samples to be analyzed by the toroidal cavity detector.

In the toroid cavity detector of the type disclosed in the '370 patent, the $B_1$ field is completely confined within the cavity formed in the housing of the toroid cavity detector and is generated when an RF signal is transmitted along the central conductor. The $B_1$ field is strongest near the central conductor and drops off as the inverse of the distance toward the outer wall of the toroid cavity. Both sensitivity and distance resolution increase with the gradient in the $B_1$ field and consequently, the toroid cavity detector provides a means to image simultaneously both the chemical shift of the targeted nuclei as well as their radial distance from the center and is well suited for NMR microscopy of films that uniformly surround the central conductor. In this regard, the amount of energy that is absorbed or transmitted by a sample within the toroid cavity detector varies with the location of the sample within the toroidal cavity such that multiple distances within the NMR active sample can be resolved by varying the transmitter pulse length. Because a homogeneous $B_0$ field is used, the chemical shift information is not destroyed by the imaging process. In addition, such toroid cavity detectors appear to be useful for investigations of solids and polymers where broad lines usually limit the spatial resolution to 50–100 $\mu$m. High-pressure and high-temperature capabilities of toroid cavities enable measurements of penetration rates in polymer or ceramic films in situ. In addition, electrochemical processes can be monitored when the central conductor is used as a working electrode.

The toroid cavity detectors of the type disclosed in the '370 patent have the advantage of providing a rugged reaction chamber that is readily machined from a variety of alloys, and the alternating magnetic field is highly confined within the cavity detector. Confining the alternating magnetic field minimizes sensitivity losses that occur through magnetic coupling with a high-pressure housing. Most importantly, the toroid cavity detector produces a well-defined magnetic field gradient, which, as noted above, varies with the inverse of the radial displacement from the center of the cavity. The resultant NMR intensity ($I/I_1$) is predicted to depend on the transmitter pulse length, t, according to the following equation:

$$I/I_0 = 2\pi h \int \sin(\gamma At/r) dr$$

where $\gamma$ is the gyromagnetic ratio, h is the height of the toroid, r is the radial distance from the center of the cavity, and A is the proportionality constant defining the magnetic field as follows:

$$B_1 = A/r$$

The $1/r$ relation for the $B_1$ field suggests that both the NMR sensitivity and the distance resolution should increase for materials that are close to the central conductor. Thus, the toroid cavity NMR resonator or detector is particularly powerful in the characterization of surface layers applied to the central conductor.

The use of a toroid cavity detector enables complete NMR spectral information to be retained during signal processing. Additionally, the strong gradient that is intrinsic to the torus enables the toroid cavity detector to provide a theoretical spatial resolution that is better than is possible with conventional MRI. Also, spatial resolution with the toroid cavity imager is less dependent on the line widths of the NMR signals used in the measurements because chemical shift information is not used to determine the distance as it is in conventional MRI.

Rotating Frame Imaging (RFI) uses the $B_1$ field gradient of an asymmetrically shaped NMR transmitter coil to achieve its spatial resolution. The transmitted energy, and thus, the pulse rotation angle of the NMR active nuclei varies with the $B_1$ field strength. Accordingly, a gradient can be used for spin localization. Through incremental increases in the pulse width, a set of amplitude-modulated spectra is derived in which the modulation frequencies yield the spatial information. Using a two-dimensional Fourier transformation, both the spatial and the chemical-shift information is resolved. This is a major advantage of the RFI technique over common MRI (Magnetic Resonance Imaging) where the chemical shift information is converted into a measure of distance by using a gradient in the main magnetic field $B_0$.

While the toroid cavity detector of the type disclosed in the '370 patent provides these significant advantages, a phenomenon known as "probe ringing" can hinder any results that are obtained from such detectors. Due to the traditional configuration of a NMR solenoid probe, the application of a strong RF pulse to the coil induces eddy currents in nearby metallic structures which may be present as RF shields or as part of the magnet housing. In the presence of a static magnetic field, these eddy currents produce a mechanical torque in the metal. A mechanical shock wave results, and a reciprocal process generates an RF signal which is detected by the coil. This phenomenon is know as "probe ringing" and is often a problem when samples are being analyzed using low frequency pulsed RF signals. This so-called "coil disease" is also thought to occur in the metal of the solenoid coil itself—the DC magnetic field and the radio frequency currents that run perpendicular to the DC magnetic field produce a torque in the metal which causes acoustic waves that are reflected back and cause the ringing. The problem is that such "ringing" obscures the NMR peaks generated by the sample. After the RF pulse, the sample undergoes a free induction decay (FID) which lasts for several microseconds (for solids) to seconds (for liquids). Both the FID and probe ringing signals are coherent and temporally coincident. As a result, it is difficult to distinguish the NMR signals from the signals generated by the probe ringing phenomenon. In fact, the peaks of the signals from the sample will be masked if the magnitude of the FID signal is weaker than the probe ringing signal and the sample signal also will be difficult to extract if the duration of the FID is shorter than the duration of the acoustic ringing.

The problems that are caused by this probe ringing phenomenon also can mask the results being attained in a toroid cavity detector. The inner wire or central conductor extends through the bottom end of the cylindrical toroid cavity detector housing and along the central, elongated axis of the housing and is connected to the upper or top end of the housing. The top and bottom ends of the housing and the side walls of the cylindrical housing provide the necessary return path for the RF signal pulses. When the RF transmitted current is traveling along the central conductor of the toroid cavity detector, it is traveling parallel to the direction of the $B_0$ field and it does not experience a force (torque). Thus, current that runs parallel to the direction of the $B_0$ field does not cause probe ringing. However, the RF current then fans out at the inside of the top end of the housing toward the inside of the side walls of the housing. As the RF current travels along the inside of the top end of the housing and along the inside of the bottom end of the housing, a mechanical force (torque) is generated that is simultaneously perpendicular to the $B_1$ and $B_0$ fields. This results in the subsequent deleterious probe ringing phenomenon.

In the case of the toroid cavity detector disclosed in the '370 patent, this probe ringing phenomenon is magnified because the top and bottom end portions of the toroid cavity detector housing are in the intense and homogeneous portion of the $B_0$ field. Moreover, the material which the housing is made, including in particular the top and bottom end portions, does not tend to adsorb much of the mechanical torquing that is caused by the flow of the RF current pulses. Instead, the housing material disclosed in the '370 patent is very effective at converting RF current torque into a mechanical impulse. By a reciprocal process, mechanical shock waves resulting from the mechanical impulse (that in turn was caused by the RF current torque) are reflected from metal/air interfaces and are efficiently back-converted to RF current. The back converted RF current is coherent and, therefore, indistinguishable from NMR signals.

Accordingly, it is an object of the present invention to provide a new and improved toroid cavity detector used in NMR tomographic imaging of a sample, in which the effects of probe ringing is greatly reduced.

It is another object of the present invention to provide a new and improved toroid cavity detector having a cylindrical housing that is elongated sufficiently in length so that the top and bottom portions, where the significant parts of the effect of probe ringing is generated, are in the weaker, fringe areas of the static main magnetic field ($B_0$) in which the housing is placed.

It is still another object of the present invention to provide a new and improved toroid cavity detector wherein certain types of material are provided along at least the inside or outside of the top and bottom ends of the cylindrically shaped toroid cavity to adsorb RF current induced mechanical shock waves that cause the effect of probe ringing.

It is yet another object of the present invention to provide a new and improved toroid cavity detector having a cylindrically shaped toroid cavity that is elongated sufficiently in length so that the top and bottom portions of the cavity are located in the weaker, fringe areas of the static main magnetic field ($B_0$) but spacers are provided adjacent to the internal top and bottom portions of the toroid cavity so as to maintain the sample being analyzed in the more intense and homogeneous portions of the $B_0$ field.

SUMMARY OF THE INVENTION

In accordance with these and many other objects of the present invention, a toroid cavity detector or resonator includes an outer cylindrical housing having a closed top end, elongated side walls and an opened bottom end that is closed by a base. A central conductor having a Teflon coated wire extends through the base and along the central axis of the cylindrical housing. The wire is connected to the closed top end of the cylindrical housing. In order to analyze a sample placed in the housing, the housing is placed in an externally applied static main homogeneous magnetic field ($B_0$) produced by a NMR device. The presence of the $B_0$ field causes the magnetic moments of a targeted class of nuclei in the sample to precess about the field's axis at a rate which is dependent on the magnetic field strength. An RF signal pulse is supplied through the wire such that an alternately energized and de-energized magnetic field ($B_1$) is produced in the toroid cavity. This $B_1$ field is oriented perpendicular to the $B_0$ field. Following the RF pulse, the response of the sample to the applied field is detected and in most applications, received signals from the energized nuclei serve as input signals for spectroscopic analysis of the sample.

In order to minimize the detrimental effects of probe ringing that can occur in such a toroid cavity detector, the housing can be altered both in its geometry and/or with respect to the materials used in at least portions of the housing where the probe ringing signals might be generated. In the case of the geometry of the toroid cavity detector housing, the cylindrically shaped housing is elongated sufficiently in length so that the top and bottom portions are located in weaker, fringe areas of the static main magnetic field ($B_0$). This tends to lessen any probe ringing signals generated by the flow of the RF current pulses through the top and bottom portions of the toroid cavity. In connection with this elongated housing design, a spacer can be positioned adjacent the top and bottom ends of the toroid cavity so that the sample contained in the toroid cavity is maintained in the more intense and homogeneous region of the static magnetic field $B_0$. With respect to the materials used in the toroid cavity housing, a material that tends to lessen the effects of probe ringing is positioned along the inside or outside of the top and bottom ends of the toroid cavity. In one embodiment of the present invention, this material is coated on the inner or other surfaces of the top and bottom ends of the toroid cavity, in another embodiment of the present invention, the top and bottom ends of the toroid cavity are made of such material and in yet another embodiment of the present invention, a plug that includes this material is affixed to the inner surfaces of the top and bottom ends of the toroid cavity. The material used for the coatings, the ends of the cavity or the plug may be metals with a high mass density and/or resistivity, such as lead or gold, but other acceptable materials can be used that will tend to lessen the effects of the probe ringing phenomenon.

BRIEF DESCRIPTION OF THE DRAWINGS

These and many other objects and advantages of the present invention will become readily apparent from consideration of the following detailed description of the embodiments of the invention shown in the accompanying drawings wherein.

DETAILED DESCRIPTION OF THE PREFERRED EMBODIMENTS

Figure 1:
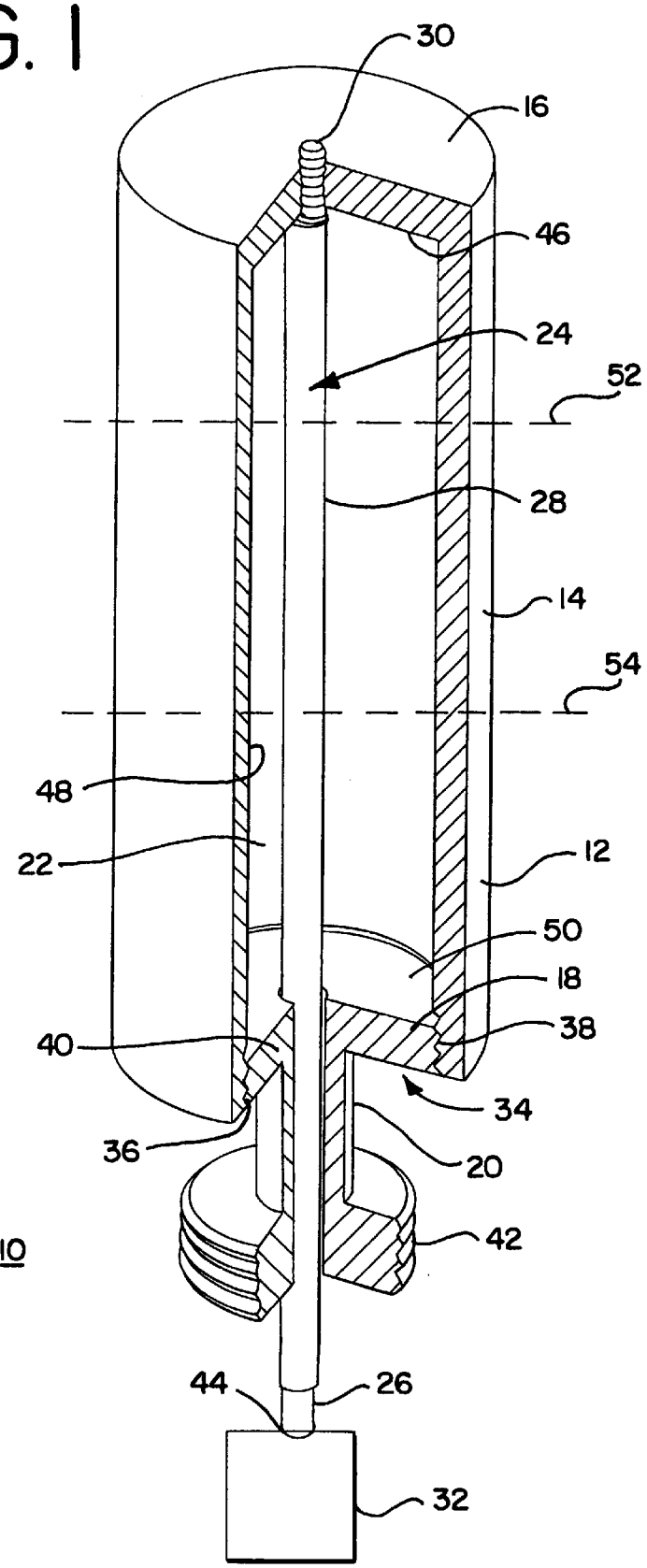
FIG. 1 is a schematic, partially cut away, partially cross-sectional, perspective view of a toroid cavity detector which embodies the present invention.

Referring now more specifically to FIG. 1 of the drawings, therein is disclosed a schematic representation of a toroid cavity detector that is generally designated by the reference numeral 10 and that embodies the present invention. The toroid cavity detector 10 has a generally elongated, cylindrical shaped housing 12 with side walls 14 extending from a closed top end 16 to a open bottom end 18. The bottom end 18 is closed by a base 20 such that an enclosed toroid cavity 22 is formed. A central conductor 24 having an inner wire 26 and an outer insulating jacket or cover 28 extends through the base 20 and along a central, elongated axis of the toroid cavity 22. The inner wire 26 is connected at its distal end 30 to the top end 16 of the toroid cavity 22.

In order to analyze a sample, the sample is placed in the toroid cavity 22 through the open bottom end 18. The toroid cavity 22 is sealed by the base 20 so that the so placed sample is retained in the toroid cavity 22. The housing 12 is placed in an externally applied static main homogeneous magnetic field ($B_0$) produced by a NMR device or the like (not shown). The axis of the $B_0$ field is along the elongated axis of the toroid cavity 22. The presence of the $B_0$ field causes the magnetic moments of a targeted class of nuclei in the sample to precess about the field's axis at a rate which is dependent on the magnetic field strength. An RF signal pulse is supplied to the inner wire 26 from an RF signal transmitter or generator 32. The RF signal pulse flows through the wire 26 such that an alternately energized and de-energized magnetic field ($B_1$) is produced in the toroid cavity 22. This $B_1$ field is oriented perpendicular to the $B_0$ field. Following the RF pulse, the response of the sample to the applied field is detected and in most applications, received signals from the energized nuclei serve as input signals for spectroscopic analysis of the sample.

As is shown in FIG. 1 of the drawings, the detector housing 12 has a generally elongated, cylindrical shape and may be machined from an elemental metal stock, an alloy or other suitable material that can provide a container that is non-magnetic, electronically conductive and withstands high pressures. For example, the housing 12 can be made of copper, stainless steel or other nonmagnetic materials. The cylindrically shaped side walls 14 of the housing 12 extends from its top portion 16 to its bottom portion 18. In the case of the housing 12, the top portion 16 is closed, i.e., it is integrally formed with the side walls 14, but alternatively, the top portion 16 can be a separate insert or plug inserted into an opening in the top portion 16. On the other hand, the bottom portion 18 of the housing 12 has a generally circular opening 34 with internal threads 36 along the side wall 14 at the opening 34. The base 20 has external threads 38 at a closure portion 40 of the base 20 enabling the closure to be threaded into the opening 34 so as to seal the opening 34. With the disposition of the closure portion 40 in the opening 34, the toroid cavity 22 is sealed so that the sample placed in the toroid cavity 22 is sealed therein. A lower base portion 42 of the base 20 can be used to mount the housing 12 to a holder or support (not shown).

The central conductor 24 extends through the elongated, central axis of the base 20. In the case of the toroid cavity detector 10 disclosed in FIG. 1, the central conductor 24 extends along the central, elongated axis of the housing 14. Alternatively, the central conductor 24 can be displaced laterally from that axis. The central conductor 24 includes the outer insulating jacket 28 with the inner wire 26 disposed therein. The jacket 28 can be made of any suitable insulating material, as for example, Teflon. The inner wire 26 is coupled at an end 44 to the RF signal transmitter 32 and is coupled at its distal end 30 to the top portion 16 of the housing 14. When the transmitter 32 supplies an RF current to the inner wire 26, the current travels along the wire 24 to the top portion 16, radiates or fans outwardly along an innermost portion 46 of the top portion 16, travels downwardly along an innermost portion 48 of the side walls 14, travels inwardly along an innermost portion 50 of the closure portion 40 of the base 20 and through the base 20 to the holder or support to which the lower base portion 42 is secured.

When the RF current is flowing through the inner wire 26 within the conductor 24, the $B_1$ field is energized within the toroid cavity 22. This field $B_1$ is generally perpendicular to the $B_0$ field that is within the toroid cavity detector 10. By pulsing of an RF current to the inner wire 26, the $B_1$ field within the toroid cavity 22 is alternately energized and de-energized. The response of the sample within the toroid cavity 22 to the applied $B_1$ field is detected and in most applications, received signals from the energized nuclei serve as input signals for spectroscopic analysis of the sample.

As indicated above, the RF current flowing along the inner wire 26 flows through and along the innermost portions 46, 48 and 50 because it needs to have a return path to the lower base portion 42. A part of this return path is along the innermost portion 46 of the top portion 16 and the innermost portion 50 of the closure portion 40 (the RF current is an AC current that tends to flow along or near the surface of the metal through which it is flowing). As the RF current flows along the top portion 16 and the closure portion 40, the RF current travels perpendicularly to the $B_0$ field is generated. The RF current is not parallel to the $B_0$ field and as a result can cause the deleterious probe ringing phenomenon because the top portion 16 and the closure portion 40 of the housing 14 tend to be mechanically torqued. The effects of this mechanical torque would tend to mask the results being attained from the $B_1$ field acting on the sample being investigated, located in the strongest and homogeneous portion of the field $B_0$. However, the housing 12 of the toroid cavity detector 10 is elongated sufficiently in length (as for example compared to the toroid cavity detectors disclosed in U.S. Pat. No. 5,574,370) so that the top portion 16 and the closure portion 40 are not within the strongest and most homogeneous portion of the $B_0$ field. In this regard, the strongest, most homogeneous portion of the $B_0$ field is relatively minimum in length along the elongated axis of the toroid cavity 22 (for example, the strongest portion of the $B_0$ field would lie between dashed lines 52 and 54).

The deleterious effects of probe ringing in the toroid cavity detector 10 also is further lessen or minimized by the addition of material along the innermost portion 46 of the top portion 16 and the innermost portion 50 of the closure 40, which material is of the type that tends to lessen the effects of probe ringing. In the toroid cavity detector 10, this material is so disposed along the surfaces of the innermost portions 46 and 50 as a coating on those surfaces. These coatings can range in thickness from sub-micron (atomic layer) to several millimeters or centimeters. While the material used can be of any type that would tend to lessen or attenuate the probe ringing effects, deposition of a metal with a high mass density and/or resistivity or characteristics exhibited by such metals would be preferable. For instance, lead or gold would be examples of such metals. It is only necessary to provide such a metal coating along the surface of the innermost portions 46 and 50 because the AC RF current flowing in the top portion 16 and the closure 40 respectively will tend to flow along or very near the surfaces of those portions (such RF currents tend to flow along the path of least resistance so that it flows on the skin or within a 10 micron outer layer of a metal conductor).

Figure 2:
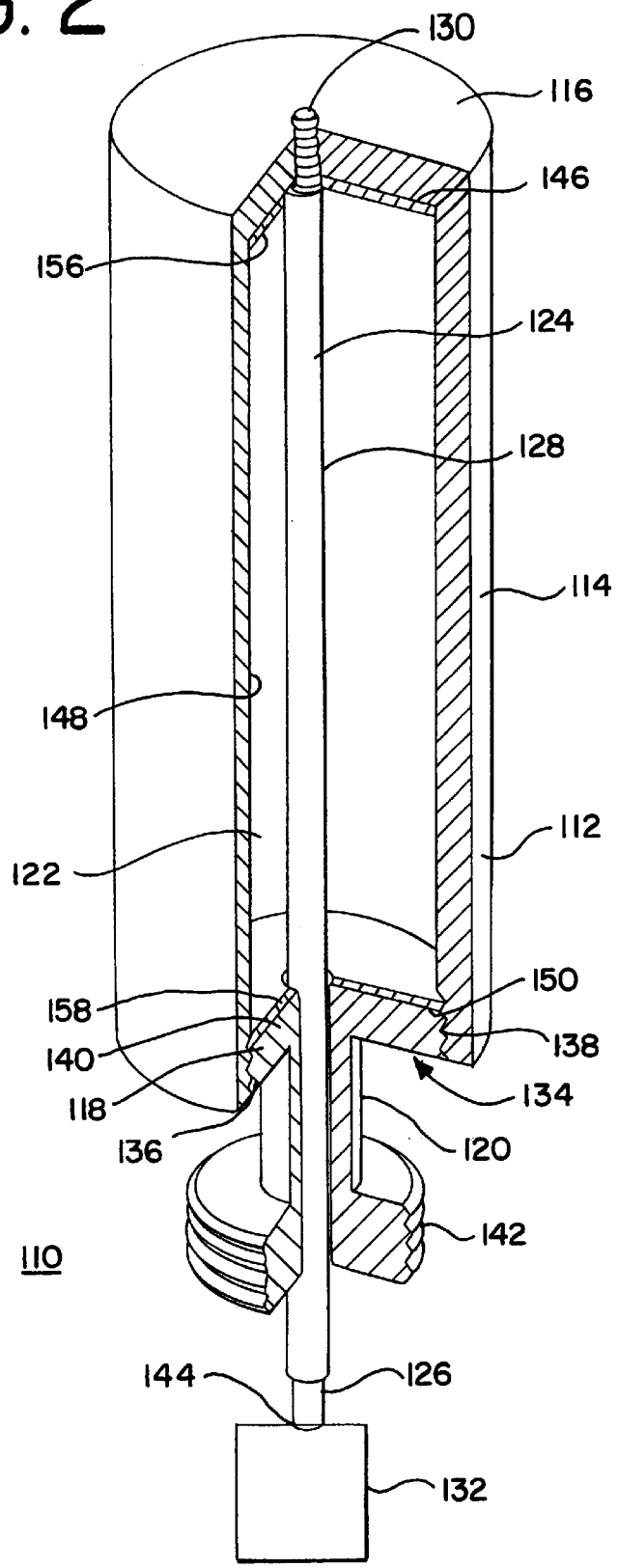
FIG. 2 is a schematic, partially cut away, partially cross-sectional, perspective view of a toroid cavity detector of the general type disclosed in FIG. 1 of the drawings showing an alternate embodiment of the present invention.

An alternate embodiment of the present invention is disclosed in FIG. 2 of the drawings. In FIG. 2, therein is disclosed a schematic representation of a toroid cavity detector that is generally designated by the reference numeral 110 and that also embodies the present invention. The toroid cavity detector 110 includes for the most part the same components included in the toroid cavity detector 10 disclosed in FIG. 1 of the drawings. Consequently, the components of the toroid cavity detector 110 are referenced by the same reference numerals as the corresponding components in the toroid cavity detector 10 except that the quantity 100 has been added to the reference numerals.

The structure and operation of the toroid cavity detector 110 is generally the same as the structure and operation of the toroid cavity detector 10. Accordingly, the above general description of the toroid cavity detector 10 is equally applicable to the toroid cavity detector 110. The difference between the toroid cavity detector 110 and the toroid cavity detector 10 is the inclusion in the toroid cavity 122 of a plug 156 affixed to the innermost portion 146 of the top portion 116 and a plug 158 affixed to the innermost portion 150 of the closure portion 140. The plug 156 can be affixed to the innermost portion 146 by press fitting or another appropriate method and the plug 158 can be affixed to the innermost portion 150 by press fitting or another appropriate method. The plugs 156 and 158 should be made of a material that tends to lessen the effects of probe ringing. While the material used can be of any type that would tend to lessen or attenuate the probe ringing effects, the plugs 156 and 158 are preferably made of a metal with a high mass density or resistivity or a metal having characteristics exhibited by such metals. For instance, lead or gold would be examples of such metals. Alternately, the plugs 156 and 158 could be made of such metals with a nonconductive layer on the surfaces facing into the toroid cavity 122. In such a case, the inner wire 126 would be coupled to the conductive portion of the plug 156.

Figure 3:
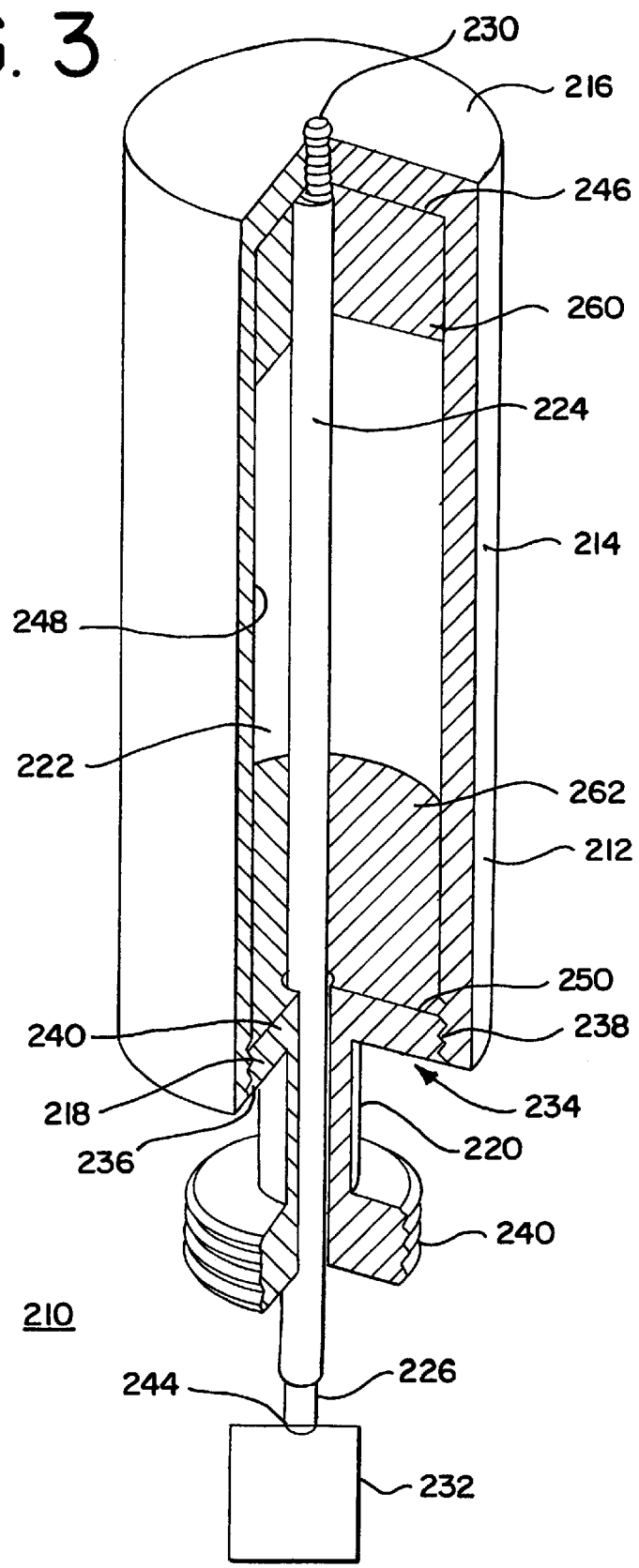
FIG. 3 is a schematic, partially cut away, partially cross-sectional, perspective view of a toroid cavity detector disclosed in FIG. 1 of the drawings showing yet another feature of the present invention.

Another alternate embodiment of the present invention is disclosed in FIG. 3 of the drawings. In FIG. 3, therein is disclosed a schematic representation of a toroid cavity detector that is generally designated by the reference numeral 210 and that also embodies the present invention. The toroid cavity detector 210 includes many of the same components included in the toroid cavity detector 10 disclosed in FIG. 1 of the drawings. Consequently, the components of the toroid cavity detector 210 are referenced by the same reference numerals as the corresponding components in the toroid cavity detector 10 except that the quantity 200 has been added to the reference numerals.

The structure and operation of the toroid cavity detector 210 is generally the same as the structure and operation of the toroid cavity detector 10. Accordingly, the above general description of the toroid cavity detector 10 is equally applicable to the toroid cavity detector 210. The difference between the toroid cavity detector 210 and the toroid cavity detector 10 is the inclusion in the toroid cavity 222 of a spacer plug 260 positioned adjacent to the innermost portion 246 of the top portion 216 and a spacer plug 262 positioned adjacent to the innermost portion 250 of the closure portion 240. By including the spacer plugs 260 and 262 at the inside of the outermost ends of the toroid cavity 222, the sample placed in the toroid cavity 222 for analysis will be disposed in that portion of the toroid cavity 222 where the intensity of the magnetic field $B_0$ is the greatest and most homogeneous.

Obviously, many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. A toroid cavity detector adapted to be placed in an externally applied magnetic field comprising:

a cylindrically shaped housing having side walls along an elongated axis extending between first and second end portions that extend generally perpendicular to said elongated axis such that a toroid cavity is formed that is adapted to receive a sample therein, the first and second end portions being sufficiently spaced apart that said first and second end portions are disposed in fringe portions of said externally applied magnetic field;

an insulated conductor extending through said second end, extending through said toroid cavity generally parallel to the elongated axis of said toroid cavity and coupled to said housing at said first end;

a pulse generator for supplying a pulsed signal to said conductor such that a time variable magnetic field internal to said toroid cavity is developed when said pulsed signal is supplied to said conductor, said time variable magnetic field being at least partially oriented perpendicular to said externally applied magnetic field; and a receiver for processing a sample response to said externally applied magnetic and said time variable magnetic fields.

2. A toroid cavity detector as set forth in claim 1 wherein said pulsed signal is a radio frequency current.

3. A toroid cavity detector as set forth in claim 1 wherein the most intense and homogeneous portion of said externally applied magnetic field is located centrally between said first and second ends of said toroid cavity.

4. A toroid cavity detector as set forth in claim 1 including a first spacer adjacent said first end of said toroid cavity and a second spacer adjacent said second end of said toroid cavity.

5. A toroid cavity detector adapted to be placed in an externally applied magnetic field comprising:

a cylindrically shaped housing having side walls along an elongated axis extending between first and second end portions that extend generally perpendicular to said elongated axis such that a toroid cavity is formed that is adapted to receive a sample therein;

an insulated conductor extending through said second end, extending through said toroid cavity generally parallel to the elongated axis of said toroid cavity and coupled to said housing at said first end;

a pulse generator for supplying a pulsed signal to said conductor such that a time variable magnetic field internal to said toroid cavity is developed when said pulsed signal is supplied to said conductor, said time variable magnetic field being at least partially oriented perpendicular to said externally applied magnetic field;

a receiver for processing a sample response to said externally applied magnetic and said time variable magnetic fields; and a probe ringing absorption material disposed along said first and second ends of said toroid cavity.

6. A toroid cavity detector as set forth in claim 5 wherein said probe ringing absorption material has a high mass density and/or resistivity.

7. A toroid cavity detector as set forth in claim 5 wherein said probe ringing absorption material is lead or gold.

8. A toroid cavity detector as set forth in claim 5 wherein said probe ringing absorption material is coated onto said first and second ends of said toroid cavity.

9. A toroid cavity detector as set forth in claim 5 wherein said probe ringing absorption material includes a first plug affixed to said first end of said toroid cavity and a second plug affixed to said second end of said toroid cavity.

10. A toroid cavity detector as set forth in claim 9 wherein said first plug includes in addition to said probe ringing absorption material a first nonconductive layer and said second plug includes in addition to said probe ringing absorption material a second nonconductive layer.

11. A method of analyzing a sample in a toroid cavity detector comprising:

placing a sample in a toroid cavity of a toroid cavity detector, said toroid cavity being cylindrical in shape and having opposed end portions;

applying a first magnetic field aligned along the major axis of said toroid cavity such that said end portions are in the fringe areas of said first magnetic field;

applying an RF signal to a central conductor extending in said toroidal cavity to produce a second magnetic field oriented generally perpendicular to said first magnetic field; and analyzing response data generated from said sample when said RF signal is supplied to said conductor.

12. A method of analyzing a sample in a toroid cavity detector as set forth in claim 11 wherein the most intense and homogeneous portion of said first magnetic field is located centrally between said ends of said toroid cavity.

13. A method of analyzing a sample in a toroid cavity detector as set forth in claim 11 including a first spacer adjacent said one of said ends of said toroid cavity and a second spacer adjacent said other end of said toroid cavity.

14. A method of analyzing a sample in a toroid cavity detector comprising:

placing a sample in a toroid cavity of a toroid cavity detector, said toroid cavity being cylindrical in shape and having opposed end portions with probe ringing absorbing material disposed at said end portions;

applying a first magnetic field aligned along the major axis of said toroid cavity;

applying an RF signal to a central conductor extending in said toroidal cavity to produce a second magnetic field oriented generally perpendicular to said first magnetic field; and analyzing response data generated from said sample when said RF signal is supplied to said conductor.

15. A method of analyzing a sample in a toroid cavity detector as set forth in claim 14 wherein said probe ringing absorption material a high mass density and/or resistivity.

16. A method of analyzing a sample in a toroid cavity detector as set forth in claim 14 wherein said probe ringing absorption material is lead or gold.

17. A method of analyzing a sample in a toroid cavity detector as set forth in claim 14 wherein said probe ringing absorption material is coated onto said ends of said toroid cavity.

18. A method of analyzing a sample in a toroid cavity detector as set forth in claim 11 wherein said probe ringing absorption material includes a first plug affixed to one of said ends of said toroid cavity and a second plug affixed to said other end of said toroid cavity.

19. A method of analyzing a sample in a toroid cavity detector as set forth in claim 18 wherein said first plug includes in addition to said probe ringing absorption material a first nonconductive layer and said second plug includes in addition to said probe ringing absorption material a second nonconductive layer.

* * * * *